United States Patent [19]

Nakazato et al.

[11] Patent Number: 4,842,136
[45] Date of Patent: Jun. 27, 1989

[54] DUST-PROOF CONTAINER HAVING IMPROVED CONSTRUCTION FOR HOLDING A RETICLE THEREIN

[75] Inventors: Hiroshi Nakazato, Ohme; Mamoru Iijima, Yokohama, both of Japan

[73] Assignee: Canon Kabushiki Kaisha, Tokyo, Japan

[21] Appl. No.: 154,308

[22] Filed: Feb. 10, 1988

[30] Foreign Application Priority Data

Feb. 13, 1987 [JP] Japan .................................. 62-029803
Feb. 13, 1987 [JP] Japan .................................. 62-029804
Feb. 13, 1987 [JP] Japan .................................. 62-029805

[51] Int. Cl.⁴ ............................................. B65D 73/02
[52] U.S. Cl. .................... 206/328; 16/48.5; 206/334; 206/449; 220/260; 220/339
[58] Field of Search ............... 206/328, 332, 334, 340, 206/477, 480, 559, 565, 450, 449, 454–456; 220/260, 339, 334; 16/48.5, 71, 78; 49/379

[56] References Cited

U.S. PATENT DOCUMENTS

| | | | |
|---|---|---|---|
| 3,615,006 | 10/1971 | Freed | 206/328 X |
| 4,313,538 | 2/1987 | Bover et al. | 206/455 |
| 4,422,547 | 12/1983 | Abe et al. | 206/328 |
| 4,432,609 | 2/1984 | Dueker et al. | 16/48.5 X |
| 4,533,043 | 8/1985 | Swain | 206/328 |
| 4,535,887 | 8/1985 | Egawa | 206/328 |
| 4,564,880 | 1/1986 | Christ et al. | 206/339 X |
| 4,681,221 | 7/1987 | Chickanosky et al. | 206/328 |
| 4,706,330 | 11/1987 | Sampson | 16/48.5 |
| 4,776,462 | 10/1988 | Kosugi et al. | 206/334 |

Primary Examiner—Bryon P. Gehman
Attorney, Agent, or Firm—Fitzpatrick, Cella, Harper & Scinto

[57] ABSTRACT

A dust-proof container for keeping therein a mask or reticle usable to transfer a pattern onto a semiconductor wafer for the manufacture of integrated circuits, is disclosed. The container includes a casing within which supporting pins for supporting the mask or reticle are formed. Also, in the casing, there are provided leaf springs for pressing the mask or reticle toward the supporting pins, and a releasing mechanism for releasing the reticle pressing force of the leaf springs. The releasing mechanism is responsive to a non-mechanical signal such as an electric signal to release the reticle pressing force. A shape memory alloy may be usable in the releasing mechanism. An opening/closing mechanism is provided to open/close a door which is operable to cover an opening formed in the casing for the insertion and extraction of the mask or reticle. A shape memory alloy may be used in the opening/closing mechanism. With the dust-proof container of the present invention, the necessity of use of a mechanical-signal transmitting system such as a linkage or otherwise in the casing is avoided. This effectively prevents creation of dust or foreign particles within the casing due to mechanical friction contact. Also, the possibility of adhesion of dust or foreign particles to the mask or reticle contained in the container can be minimized.

3 Claims, 4 Drawing Sheets

DUST-PROOF CONTAINER HAVING IMPROVED CONSTRUCTION FOR HOLDING A RETICLE THEREIN

FIELD OF THE INVENTION AND RELATED ART

This invention relates to a dust-proof container for keeping therein a reticle or photomask (hereinafter simply "reticle") used in the manufacture of semiconductor devices such as large scaled integrated circuits.

With the increasing degree of integration of semiconductor devices, the adhesion of dust or minute foreign particles to a reticle used in a photolithographic process of a semiconductor wafer becomes more undesirable because it leads to a decrease in the yield. In order to avoid adhesion of foreign particles, a reticle is kept in a dust-proof container when it is not used. Further, the conveyance of a reticle kept in the container to an exposure station in a semiconductor device manufacturing exposure apparatus is automatized and, additionally, the extraction of the reticle out of its container is made in an unmanned process.

Conventional dust-proof containers are formed by a box-like article having therein reticle supporting members upon which a reticle is placed. Since, however, a reticle is simply placed and is not held within the container, there is a possibility of damage of the reticle due to vibration or impact caused at the time of transportation of the container. Additionally, such vibration or otherwise easily leads to creation of dust or particles which disadvantageously deteriorates the precision of a circuit pattern formed on the reticle.

In an attempt at avoiding these problems, a dust-proof container having a reticle holding means has been proposed. According to this proposal, the container is formed by a casing which comprises a lower member (tray) and an upper member (lid), wherein a reticle is placed on supporting members formed on the lower tray member. When the upper lid member is closed, a keeping member which is formed by a rigid element and provided pivotably upon an inside surface of the upper lid member operates to press the reticle through a linkage, a coiled spring or otherwise. Also, the keeping member is coupled, by way of the linkage or the coiled spring, to a door which is provided to openably close a reticle introduction/extraction opening formed in a front face of the casing. Thus the keeping member is mechanically pulled in association with the opening movement of the door, with the result that the keeping member is pivotally moved so as to disengage the reticle.

In this type of dust-proof container, however, the pivotally movable structure of the keeping member, itself, is a source of creation of dust or foreign particles. Namely, the mechanical friction at a connecting rotational shaft portion easily creates fine particles. Further, the mechanical friction of a connection portion of the linkage or the coiled spring and the vibration, impact or otherwise at the time of expansion/contraction of the coiled spring easily cause adhesion of the particles to the reticle. There are similar problems in regard to the mechanical coupling of an opening/closing mechanism for the swingable door of the container, which mechanism is disposed outside the container. Further, such mechanical connection itself is undesirable because it requires a large number of parts.

SUMMARY OF THE INVENTION

It is accordingly a primary object of the present invention to provide a dust-proof container which effectively prevents creation of dust or foreign particles within the container and which allows, with a simple structure, the opening and closing motion of a door and/or the keeping and holding action for a reticle placed in the container.

In accordance with one preferred form of the present invention, to achieve this object, there is provided a dust-proof container in which a spring member is provided to press the reticle and/or urge a door to close the same and in which a force acting against the force of the spring member is created by an element, such as a shape memory alloy, a bimetal or otherwise, which is deformable in response to the application of an energy such as an electric power, heat, light or otherwise. This element is provided at a predetermined position and so as to be operationally associated with the spring member.

With the dust-proof container according to this preferred form of the present invention, a reticle can be held immovable within the container without use of a mechanical linkage or otherwise. Also, use of a specific deformable element such as a shape memory alloy or otherwise allows releasing of the pressing action by a reticle pressing spring, without use of a linkage, a coiled spring or otherwise. This is effective to prevent creation of dust or foreign particles due to the mechanical friction in the container. Thus, undesirable adhesion of such particles to a reticle and the resultant damage to the transfer of the pattern of the reticle onto a wafer at the time of the photoprinting, can be prevented effectively. Therefore, an increased yield is ensured. Further, an opening/closing mechanism for opening/closing a door provided at a reticle introduction/extraction opening of a container can be made simple, with an advantageous result of reduction in the number of parts. Also, use of a linkage or a coiled spring is not necessary for the opening/closing motion of the door, with an advantageous result that the possibility of dust creation is minimized.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
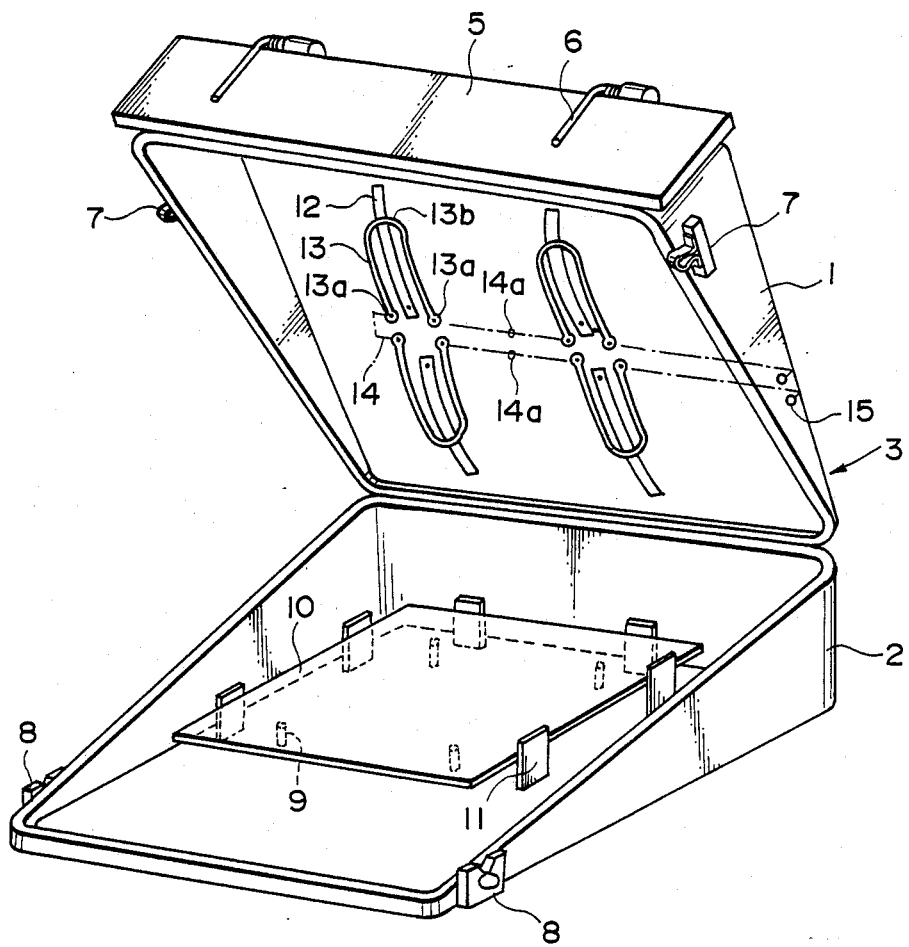
FIG. 1 is a perspective view of a dustproof container according to one embodiment of the present invention.
Figure 2:
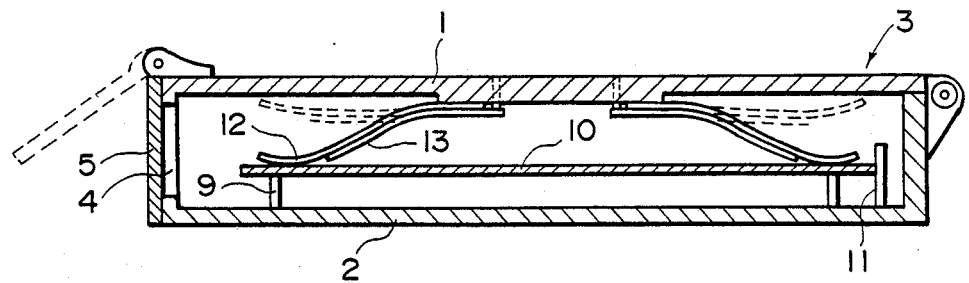
FIG. 2 is a sectional view of the container of the FIG. 1 embodiment.

Referring first to FIG. 1, there is shown a dust-proof container according to one embodiment of the present invention. In FIG. 1, the container is shown in an open state. FIG. 2 is a sectional view showing a major portion of the container which is in a closed state. In this embodiment, the container is usable to keep therein a reticle for use in the pattern printing upon a semiconductor wafer for the manufacture of semiconductor devices. A particular circuit pattern is formed on a reticle. The container includes an upper member (lid) 1 and a lower member (tray) 2 which cooperate with each other to provide a casing 3. At the back of the container, the upper lid 1 is hinged to the lower tray 2 so that it can be opened and closed. In the front face of the upper lid 1, there is formed an opening 4 for allowing automatic introduction and extraction of a reticle 10, as seen from FIG. 2. Door 5 is provided so as to sealingly close the opening 4, the door 5 being hinged to the upper lid 1. The door 5 is continuously urged by a spring 6 in a direction closing the opening 4. The lower tray 2 is provided with four reticle supporting pins 9 each being in the form of a protrusion. In the inside of the lower tray 2 and at the left and right side surfaces and the rear surface thereof, there are provided reticle positioning stoppers 11. Upon loading, the reticle 10 is placed on the supporting pins 9 while being guided by the stoppers 11. On the outer side surfaces of the upper lid 1 and the lower tray 2, a pair of locking members 7 and 8 of resilient insertion type are mounted. These locking members are effective to disengageably couple the upper lid 1 and the lower tray 2 to each other. On the inside surface of the upper lid 1, four reticle keeping leaf springs 12 are mounted. Each leaf spring 12 has one end fixed to the upper lid so that it forms a "cantilevered leaf spring". As depicted by solid lines in FIG. 2, each leaf spring 12 is arranged to press the reticle 10, placed on the lower tray 2, from the above toward the pins 9.

There are provided four releasing members 13 each engages corresponding one of the leaf springs 12. In this embodiment, each releasing member 13 is formed by a shape memory alloy which can be made of an alloy of titanium and nickel. Each releasing member 13 has a U-shape as illustrated, and a curved portion 13b thereof engages with corresponding one of the leaf springs 12 while end portions thereof are connected to terminals 13a, respectively. The terminals 13a are connected, in series, by means of a patterned wiring or a suitable wiring such as denoted at 14 or, alternatively, they are individually connected to electrode terminals 15 provided on the outer side surface of the upper lid 1. The shape memory alloy which forms a releasing member 13 is arranged so that it normally has a shape, such as depicted by a solid line in FIG. 2, that does not interfere with the application of a pressing force of a corresponding leaf spring 12 to the reticle 10 while, on the other hand, it is deformed and moved upwardly as depicted by a broken line in FIG. 2 in response to the supply of an electric current from the electrode terminals 15, to thereby lift the leaf spring 12 so as to separate the same from the reticle 10.

When the reticle 10 is introduced into the dust-proof container of the above-described structure and when the upper lid 1 is closed, the closing motion of the lid 1 causes the leaf springs 12 to press the reticle 10 against the pins 9. By this, the reticle 10 is held immovable within the container. It will be readily understood that a plurality of containers each being such as described hereinbefore may be placed, in a layered fashion, in an automatic reticle loading mechanism which is operationally coupled to an exposure apparatus or otherwise.

For automatic extraction of a reticle contained in the container 3, an electric current is applied to each of the releasing members 13 each being formed by a shape memory alloy. In response thereto, the shape memory alloy deforms to separate the leaf spring 12 from the reticle 10, as depicted by the broken line in FIG. 2 to thereby release the pressing force of the leaf spring. In this state, the door 5 is opened such as depicted by a broken line in FIG. 2, and the reticle 10 contained in the container is extracted out of the container by means of an automatic loading/unloading mechanism, not shown. For automatic loading of the reticle 10 into the container after the reticle 10 is used for the exposure (photoprinting), the reticle 10 is inserted into the container with the shape memory alloy being continuously energized. After the reticle 10 is placed on the pins 9, the supply of the electric current is intercepted. As a result, the shape memory alloy takes again its initial shape as depicted by the solid line in FIG. 2, such that the leaf spring 12 urge again the reticle 10 to hold the same immovable on the pins 9.

The number, the position and the shape of the leaf springs 12 constituting the reticle pressing means may be changed as desired. Further, the manner of electric connection of the electrodes for the shape memory alloy, the position of the electrode terminal and so on may be changed as desired. The electrode terminal 15 may be provided at a position best suited to the structure of an apparatus into which the container is incorporated. For example, while in the FIG. 1 embodiment four shape memory alloys are electrically connected in series so that two ends are connected to the electrode terminals 15, the manner of electric connection may be changed so that the terminals 13a for each shape memory alloy may be directly connected to the electrode terminals 15 (namely, eight terminals may be connected to the electrode terminals 15). Alternatively, at the points denoted at 14a in FIG. 1, the wiring may be branched toward another set of electrode terminals 15. By selecting an appropriate manner of wiring, only a required shape memory alloy or alloys may be selectively energized.

Figure 3A:
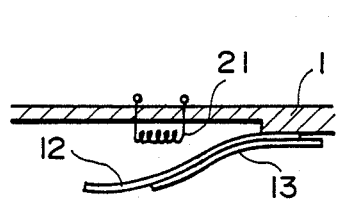
FIGS. 3A-3E are fragmentary sections, respectively, showing modified forms of the FIG. 1 embodiment.
Figure 3B:
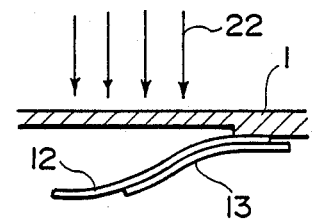

In place of direct application of an electric current to the releasing members 13, a suitable heating means 21 (see FIG. 3A) such as a rubber heater or otherwise may be used to directly heat the releasing member 13 or to indirectly heat the releasing member from the outside of the container and by way of a suitable heat transmitting member. It is a possible alternative that, in place of the application of an electric current, the releasing member 13 may be irradiated with heat rays 22 such as infrared rays. The releasing member 13 is operable in the similar manner in response to the irradiation of such heat rays.

Figure 3C:
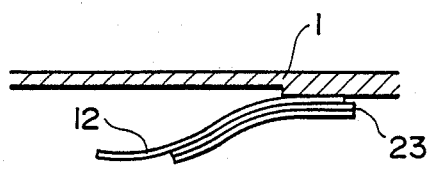

The shape memory alloy used in the FIG. 1 embodiment may be replaced by a bimetal 23 such as shown in FIG. 3C. By heating the bimetal 23, it can deform so as to separate the leaf spring 12 from the reticle 10. Further, the leaf spring 12 itself may be formed by a bimetal.

Figure 3D:
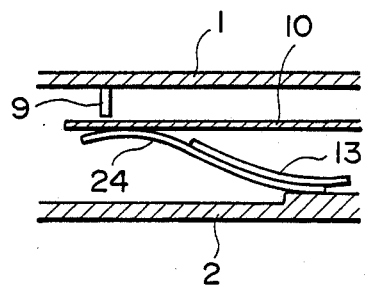
Figure 3E:
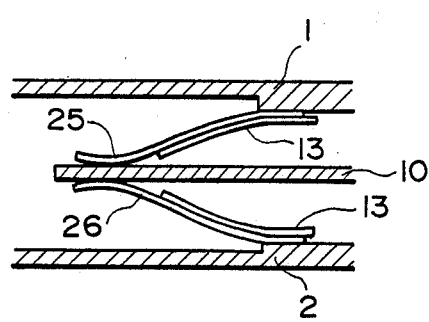

The container may be modified so that a reticle 10 is supported by an upper lid 1 side and the supported reticle 10 is held immovable by means of leaf springs 24 which are provided on a lower tray 2 side, such as illustrated in FIG. 3D. Also, leaf springs 25 and 26 may be provided both on an upper lid 1 side and a lower tray 2 side, such that a reticle 10 is held immovable by pressing forces applied thereto from the opposite sides thereof.

Figure 4:
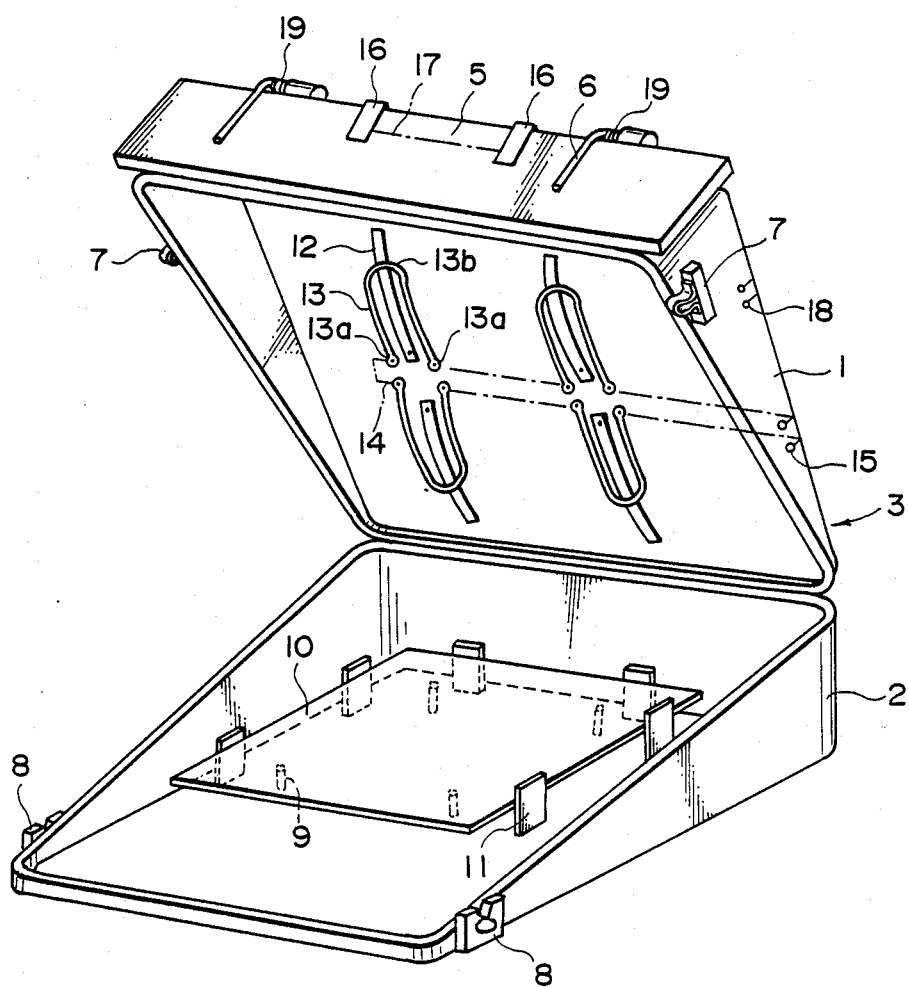
FIG. 4 is a perspective view of a dustproof container according to another embodiment of the present invention.
Figure 5:
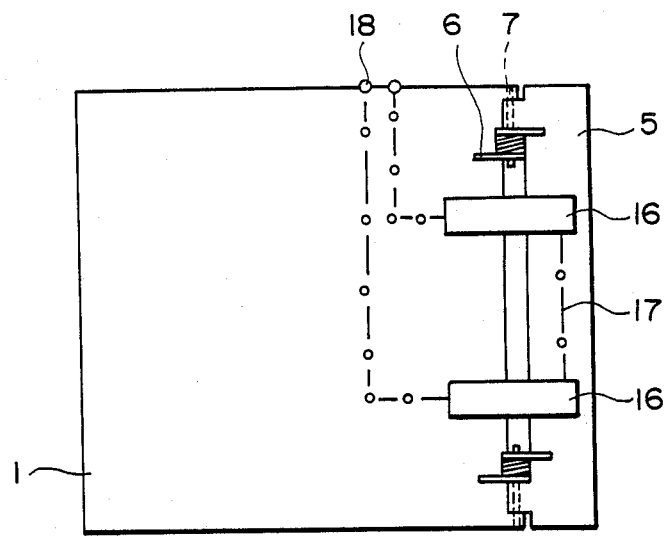
FIG. 5 is a schematic plan view of the container of the FIG. 4 embodiment.
Figure 6A:
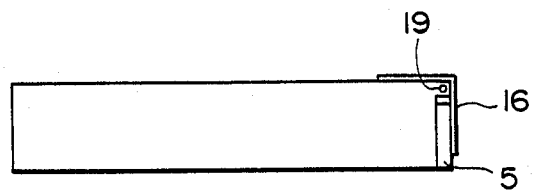
FIGS. 6A and 6B are schematic views, respectively, showing the opening/closing motion of a door used in the FIG. 4 embodiment.
Figure 6B:
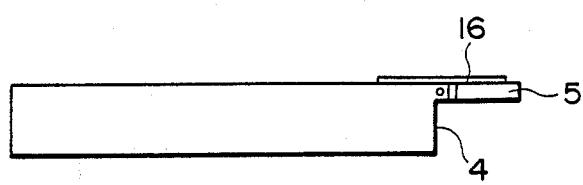

FIG. 4 is a perspective view showing a dust-proof container according to another embodiment of the present invention. FIG. 5 is a plan view of the container of the FIG. 4 embodiment. An upper lid 1 and a lower tray 2 are cooperable to provide a closed casing 3. At the back of the casing 3, the upper lid 1 is hinged to the lower tray 2 so that it can be opened and closed. At the front face of the upper lid 1, an opening 4 (see FIG. 6B) is formed for automatic introduction and extraction of a reticle 10. Door 5 provided to sealingly cover the opening 4 is coupled to the upper lid 1 by means of hinges 19. The door 5 is continuously urged by springs 6 in a direction closing the opening 4. The upper lid 1 and the door 5 are connected to each other by means of shape memory alloys 16. Each shape memory alloy 16 is adapted to deform in a direction opening the door 5 when a predetermined temperature is established in response to the application of an electric current or otherwise. Denoted at 17 in FIG. 4 is a wiring means for electrically connecting the shape memory alloys 16. Denoted at 18 in FIG. 4 are exposed electric terminals which are provided on the outer side surface of the upper lid 1.

The lower tray 2 is provided with four reticle supporting pins 9 each being in the form of a protrusion. In the inside of the lower tray 2 and at the left and right side surfaces and the rear surface thereof, there are provided reticle positioning stoppers 11. Upon loading, the reticle 10 is placed on the supporting pins 9 while being guided by the stoppers 11. On the outer side surfaces of the upper lid 1 and the lower tray 2, a pair of locking members 7 and 8 of resilient insertion type are mounted. These locking members are effective to disengageably couple the upper lid 1 and the lower tray 2 to each other. On the inside surface of the upper lid 1, four reticle keeping leaf springs 12 are mounted. Each leaf spring 2 has one end fixed to the upper lid so that it forms a "cantilevered leaf spring", with its free end being adapted to press the reticle 10, placed on the lower tray 2, from the above toward the pins 9.

There are provided four releasing members 13 each engages a corresponding one of the leaf springs 12. In this embodiment, each releasing member 13 is formed by a shape memory alloy which can be made of an alloy of titanium and nickel. Each releasing member 13 has a U-shape as illustrated, and a curved portion 13b thereof engages with corresponding one of the leaf springs 12 while end portions thereof are connected to terminals 13a, respectively, fixed to the upper lid 1. The terminals 13a are connected, in series, by means of a patterned wiring or a suitable wiring such as denoted at 14 or, alternatively, they are individually connected to electrode terminals 15 provided on the outer side surface of the upper lid 1. The shape memory alloy which forms a releasing member 13 is arranged so that it normally has a shape, such as depicted by a solid line in FIG. 2, that does not interfere with the application of a pressing force of a corresponding leaf spring 12 to the reticle 10 while on the other hand, it is deformed and moved upwardly as depicted by a broken line in FIG. 2 in response to the supply of an electric current from the electrode terminals 15, to thereby lift the leaf spring 12 so as to separate the same from the reticle 10.

When the reticle 10 is introduced into the dust-proof container of the above-described structure and when the upper lid 1 is closed, the closing motion of the lid 1 causes the leaf springs 12 to press the reticle 10 against the pins 9. By this, the reticle 10 is held immovable within the container. It will be readily understood that a plurality of containers each being such as described hereinbefore may be placed, in a layered fashion, in an automatic reticle loading mechanism which is operationally coupled to an exposure apparatus or otherwise.

For automatic extraction of a reticle, electric currents are supplied to the shape memory alloys 16 from the electrode terminals 18. In response thereto, the shape memory alloys 16 deform, from a state shown in FIG. 6A to a state shown in FIG. 6B, to thereby open the door 5 of the upper lid 1. Subsequently, electric currents are supplied to the shape memory alloys 13 so that the pressing of the reticle 10 is released. Thereafter, by use of an automatic loading/unloading mechanism (not shown), the reticle 10 kept in the container is extracted. In order to automatically put the reticle 10 again into the container after the reticle 10 is used, the reticle 10 is introduced into the container with the door 5 being maintained open as a result of the energization of the shape memory alloys 16. After the reticle 10 is placed on the supporting pins 9, the supply of the electric currents to the shape memory alloys 16 is intercepted, with the result that each shape memory alloy 16 deforms under the influence of the spring 6 and takes its initial shape. Thus, the door 5 again closes the opening 4 of the upper lid 1.

The number, the position and the shape of the leaf springs 12 constituting the reticle pressing means may be changed as desired. Further, the manner of electric connection of the electrodes for the shape memory alloy, the position of the electrode terminal and so on may be changed as desired. The electrode terminal 15 may be provided at a position best suited to the structure of an apparatus into which the container is incorporated. Further, by selecting an appropriate manner of wiring, only a desired shape memory alloy 16 may be selectively energized.

Further, in place of direct application of an electric current to the shape memory alloy 16 for the operation, a suitable heating means such as a rubber heater may be used to directly heat the releasing member or, if desired, to indirectly heat the releasing member by way of a suitable heat transmitting member. Additionally, in place of the application of an electric current, the shape memory alloys 16 may be irradiated with heat rays such as infrared rays. In such case, the heat memory alloys may be operable in a similar manner in response to the irradiation of the heat rays.

While the invention has been described with reference to the structures disclosed herein, it is not confined to the details set forth and this application is intended to cover such modifications or changes as may come within the purposes of the improvements or the scope of the following claims.

What is claimed is:
1. A dust-proof container, comprising:
a casing for keeping therein a reticle, said casing having an opening for allowing insertion and extraction of the reticle therethrough;
a door pivotably supported by said casing and being adapted to cover said opening;
a plate-like spring member cantilevered in said casing, said spring member being operable to press the recticle to hold the same within the casing;
a releasing member cantilevered in said casing so as to be related to said spring member, said releasing member being comprised of a shape-memory alloy that is deformable, in response to supply of a predetermined electric energy, in a direction effective to separate said spring member from the recticle, and a connection terminal provided on said casing through which electric energy may be supplied to said shape-memory alloy releasing member.

2. A dust-proof container according to claim 1, wherein said casing includes upper and lower members hinged with each other, said lower member having a plurality of pins for supporting the reticle, said upper member having a plurality of spring members each as aforesaid and a plurality of releasing members each as aforesaid, and said door being supported by said upper member.

3. A dust-proof container according to claim 1, wherein said door is urged in a direction closing said opening and wherein a shape-memory alloy is provided between said door and said casing, said shape memory alloy being deformable in response to supply of a predetermined energy in a direction effective to open said door.

* * * * *